(12) United States Patent
Kotani et al.

(10) Patent No.: US 9,134,608 B2
(45) Date of Patent: Sep. 15, 2015

(54) POSITIVE PHOTOSENSITIVE RESIN COMPOSITION, METHOD FOR PRODUCING PATTERNED CURED FILM AND ELECTRONIC COMPONENT

(75) Inventors: Masashi Kotani, Ibaraki (JP); Masayuki Ooe, Ibaraki (JP); Taku Konno, Ibaraki (JP); Tomonori Minegishi, Ibaraki (JP); Keishi Ono, Ibaraki (JP)

(73) Assignee: HITACHI CHEMICAL DUPONT MICROSYSTEMS, LTD., Tokyo (JP)

( * ) Notice: Subject to any disclaimer, the term of this patent is extended or adjusted under 35 U.S.C. 154(b) by 0 days.

(21) Appl. No.: 13/522,817

(22) PCT Filed: Jan. 18, 2011

(86) PCT No.: PCT/JP2011/000216
§ 371 (c)(1),
(2), (4) Date: Jul. 18, 2012

(87) PCT Pub. No.: WO2011/089877
PCT Pub. Date: Jul. 28, 2011

(65) Prior Publication Data
US 2012/0288798 A1 Nov. 15, 2012

(30) Foreign Application Priority Data
Jan. 21, 2010 (JP) .................................. 2010-011354

(51) Int. Cl.
G03F 7/023 (2006.01)
G03F 7/40 (2006.01)
G03F 7/022 (2006.01)

(52) U.S. Cl.
CPC ............ *G03F 7/0226* (2013.01); *G03F 7/0233* (2013.01); *G03F 7/40* (2013.01)

(58) Field of Classification Search
CPC ....... G03F 7/0233; G03F 7/30; G03F 7/0226; G03F 7/40
USPC ........... 430/18, 191, 192, 193, 326, 906, 165, 430/330
See application file for complete search history.

(56) References Cited

U.S. PATENT DOCUMENTS

| 4,093,461 | A | 6/1978 | Loprest et al. |
| 4,395,482 | A | 7/1983 | Ahne et al. |
| 6,881,765 | B2 * | 4/2005 | Sasaki ............................ 522/167 |
| 2007/0042296 | A1 * | 2/2007 | Sasaki et al. ................ 430/281.1 |
| 2009/0166818 | A1 * | 7/2009 | Banba et al. ..................... 257/642 |
| 2009/0239080 | A1 * | 9/2009 | Ito et al. ....................... 428/411.1 |
| 2010/0239977 | A1 * | 9/2010 | Banba ........................ 430/270.1 |

FOREIGN PATENT DOCUMENTS

| JP | 52-13315 | 2/1977 |
| JP | 1-60630 B2 | 12/1989 |
| JP | 2006-008740 A | 1/2006 |
| JP | 2008-107512 A | 5/2008 |
| JP | 2008-139328 A | 6/2008 |
| JP | 2008-145579 A | 6/2008 |
| JP | 2008-224970 A | 9/2008 |
| WO | 2007/063721 A1 | 6/2007 |
| WO | 2009/022732 A1 | 2/2009 |

OTHER PUBLICATIONS

Journal of Macromolecular Science—Chemistry, vol. A24, No. 12, 1407-1422 (1987).
"Surface Technology" published by the "Surface Finishing Society of Japan", vol. 47 (1996), 529-535.
International Search Report issued in corresponding application PCT/JP2011/000216, completed Feb. 9, 2011 and mailed Feb. 22, 2011.
International Preliminary Report on Patentability issued in corresponding application PCT/JP2011/000216, issued Aug. 7, 2012 and mailed Aug. 16, 2012.

* cited by examiner

*Primary Examiner* — John Chu
(74) *Attorney, Agent, or Firm* — Griffin & Szipl, P.C.

(57) ABSTRACT

A positive photosensitive resin composition including:
(a) a resin capable of being dissolved in an aqueous alkaline solution;
(b) a compound having two or more oxetanyl groups;
(c) a diazonaphthoquinone compound; and
(d) a solvent.

9 Claims, 2 Drawing Sheets

POSITIVE PHOTOSENSITIVE RESIN COMPOSITION, METHOD FOR PRODUCING PATTERNED CURED FILM AND ELECTRONIC COMPONENT

This is a National Phase Application in the United States of International Patent) Application No. PCT/JP2011/000216 filed Jan. 18, 2011, which claims priority on Japanese Patent Application No. 2010-011354, filed Jan. 21, 2010. The entire disclosures of the above patent applications are hereby incorporated by reference.

TECHNICAL FIELD

The invention relates to a positive photosensitive resin composition, a patterned cured film, a method for producing thereof and an electronic component. In particular, the invention relates to a positive photosensitive resin composition capable of forming a surface protective film and/or an interlayer insulating film of a semiconductor element or the like and a method for producing a heat resistant patterned cured film using the composition.

BACKGROUND ART

Conventionally, in an interlayer insulating film and a surface protection film of a semiconductor element, a polyimide resin or a polybenzoxazole resin which have excellent heat resistance, electric characteristics and mechanical properties in combination has been used.

In recent years, with a further advance in integration and an increase in size of a semiconductor element, a package sealing resin has been required to be thin and small. Further, a method for surface mounting or the like by LOC (lead-on-chip) or reflow soldering has been used. Under such circumstances, there is an increasing demand for a polyimide resin which has more excellent mechanical properties, heat resistance or the like than ever.

In response to these requirements, a photosensitive polyimide obtained by imparting photosensitivity to a polyimide resin itself has come to be used. By using a photosensitive polyimide, a pattern fabricating process can be simplified, whereby a complicated production process can be shortened. A conventional photosensitive polyimide or a heat resistant photoresist using its precursor is well known, as well as its application.

As the improvement of these technologies, in recent years, a positive photosensitive resin composition which can be developed in an aqueous alkaline solution has been proposed. As for the method for producing a positive photosensitive polyimide, a method in which a 2-nitrobenzyl group is introduced into a polyimide precursor through an ester bond (Non-Patent Document 1, for example), a method in which a naphthoquinone diazide compound is mixed with soluble dihydroxylimide or a polybenzoxazole precursor (Patent Documents 1 and 2, for example), a method in which naphthoquinone diazide is mixed with a polyimide precursor (Patent Document 3, for example), and the like can be given.

A method in which an oxetane compound is added to a positive photosensitive compound is often used for preventing generation of an undeveloped part (scum) or for improving reflow resistance and solvent resistance (Patent Documents 4 and 5, for example). For these compositions, it is essential to add an aluminum complex and an active silicon compound for promoting the ring opening of the oxetane compound.

On the other hand, in recent years, in respect of a short lead time and a low cost, a surface mounting process in which an Ni film and an Au film are formed by using electroless plating, followed by attaching a solder ball by means of laser has been used more actively than ever. Electroless plating includes a step called a zincate treatment in which a treatment is conducted with a strong alkaline solution having a pH of 13 or more. Therefore, a polybenzoxazole resin or a polyimide resin having excellent resistance to this strong alkaline solution is needed (Non-Patent Document 2, for example).

However, with a conventional positive photosensitive resin composition using a polybenzoxazole resin or a polyimide resin, it is impossible to satisfy simultaneously properties such as high sensitivity and high resolution to g rays and i rays, possibility of development in a general-purpose developer and resistance to strong alkali.

RELATED ART DOCUMENTS

Patent Documents

Patent Document 1: JP-B-S64-60630
Patent Document 2: U.S. Pat. No. 4,395,482
Patent Document 3: JP-A-S52-13315
Patent Document 4: JP-A-2008-145579
Patent Document 5: WO07/063721

Non-Patent Documents

Non-Patent Document 1: J. Macromol. Sci., Chem., vol. A24, 12, 1407 (1987)
Non-Patent Document 2: "Surface Technology" published by the "Surface Finishing Society of Japan", vol. 47 (1996), p. 529

SUMMARY OF THE INVENTION

The invention has been made in respect of the above-mentioned circumstances. The invention is aimed at providing a positive photosensitive resin composition which can be developed in a general-purpose developer and is improved in resistance to a strong alkaline solution which is used in an electroless plating process.

The invention relates to the following:
1. A positive photosensitive resin composition comprising:
(a) a resin capable of being dissolved in an aqueous alkaline solution;
(b) a compound having two or more oxetanyl groups;
(c) a diazonaphthoquinone compound; and
(d) a solvent.
2. The positive photosensitive resin composition according to 1, wherein the component (a) is a polymer having a phenolic hydroxyl group.
3. The positive photosensitive resin composition according to 1 or 2, wherein the component (a) is a polymer which has a structural unit represented by the following formula (I):

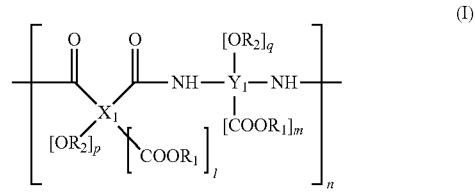

wherein $X_1$ is an organic group having 2 to 8 valences; $Y_1$ is an organic group having 2 to 8 valences; $R_1$ is independently a hydrogen atom or an organic group having 1 to 20 carbon atoms; R₂ is independently hydrogen or a monovalent organic group; p and q are independently an integer of 0 to 4; l and m are independently an integer of 0 to 2; l+m+p+q is 1 or more; and n is an integer of 2 or more indicating the number of structural units in the polymer.

4. The positive photosensitive resin composition according to any of 1 to 3, wherein the component (b) is a compound represented by the following formula:

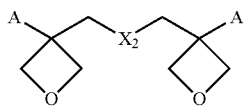

wherein $X_2$ is a single bond or a divalent organic group containing at least one of an alkylene group, an aromatic ring, an oxygen atom and a sulfur atom; and A is an alkyl group having 1 to 10 carbon atoms.

5. The positive photosensitive resin composition according to any of 1 to 4, wherein the component (b) is contained in an amount of 1 to 40 parts by weight and the component (c) is contained in an amount of 1 to 50 parts by weight relative to 100 parts by weight of the component (a).

6. A cured film obtained by curing the positive photosensitive resin composition according to any of 1 to 5.

7. A method for producing a patterned cured film comprising the steps of:

applying the positive photosensitive resin composition according to any of 1 to 5 on a supporting substrate, followed by drying to form a photosensitive resin film;

exposing the photosensitive resin film to light;

developing the photosensitive resin film after the light exposure in an aqueous alkaline solution to obtain a patterned resin film; and subjecting the patterned resin film to a heat treatment to obtain a patterned cured film.

8. An electronic component comprising the cured film according to 6 as an interlayer insulating layer or a surface protective layer.

According to the invention, it is possible to provide a positive sensitive resin composition which can be developed in a general-purpose developer and has excellent resistance to a strong alkaline solution which is used in electroless plating.

MODE FOR CARRYING OUT THE INVENTION

Figure 1:
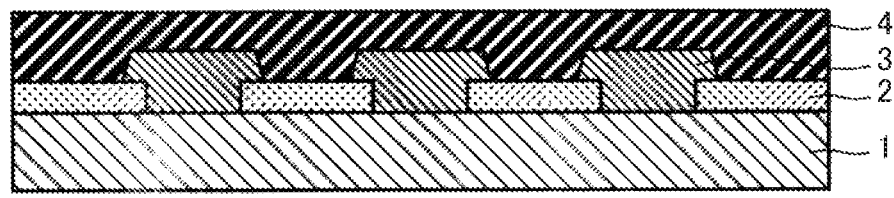
FIG. 1 is a schematic cross-sectional view explaining the steps of manufacturing a semiconductor device having a multilayer wiring structure according to one embodiment of the invention.

The positive sensitive resin composition of the invention comprises the following component (a), component (b), component (c) and a solvent (d).

(a) a resin which can be dissolved in an aqueous alkaline solution;

(b) a compound having two or more oxetanyl groups;

(c) a diazonaphthoquinone compound (d) solvent.

The component (a) is soluble in an aqueous alkaline solution. As examples of an aqueous alkaline solution, an alkaline aqueous solution such as an aqueous solution of tetramethyl ammonium hydroxide, an aqueous metal hydroxide solution, an aqueous organic amine solution or the like can be given, for example.

In general, an aqueous solution of tetrabutyl ammonium having a concentration of 2.38 wt % is used. Therefore, it is more preferred that the component (a) be soluble in this aqueous solution.

One standard showing that the component (a) is soluble in an alkaline developer will be described below. A varnish obtained by dissolving the component (a) alone or each of the component (b) and the component (c) which will be explained later in due order in the solvent (d) is applied to a substrate such as silicon wafer by spin coating to obtain a coating film having a thickness of about 5 μm. This coating film is immersed in any one of an aqueous tetramethyl ammonium hydroxide solution, an aqueous metal hydroxide solution and an aqueous organic amine solution at 20 to 25° C. If it is capable of being dissolved to form a homogenous solution, the component (a) is deemed as being soluble as an alkaline developer.

It is more preferred that the component (a) be a polymer having a structural unit represented by the following formula (I):

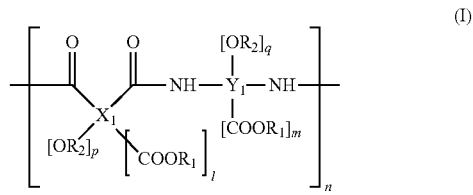

wherein $X_1$ is an organic group having 2 to 8 valences. $Y_1$ is an organic group having 2 to 8 valences. $R_1$s are independently a hydrogen atom or an organic group having 1 to 20 carbon atoms. $R_2$s are independently a hydrogen atom or a monovalent organic group. p and q are independently an integer of 0 to 4. l and m are independently an integer of 0 to 2; l+m+p+q is 1 or more. It is preferred that at least one of one or more $R_2$ is a hydrogen atom. If $R_2$ is a hydrogen atom, $X_1$ or $Y_2$ bonding to $OR_2$ is an organic group having an aromatic ring. $OR_2$ is bonded to the aromatic ring. n is an integer of 2 or more showing the number of the structural unit in the polymer, and is preferably an integer of 3 to 10.

In the polymer which has a structural unit represented by formula (I), as shown in formula (I), two amide bonds are included in one structural unit. Generally, this amide bond is formed by a reaction of carboxylic acid (polycarboxylic acid such is di-, tri- and tetrapolycarboxylic acid), its anhydride, or its derivative (hereinafter often referred to as carboxylic acid) with diamine.

Therefore, the organic group having 2 to 8 valences of $X_1$ in formula (I) is, in the structure of carboxylic acid, an organic group which shows the structure of a part excluding the carboxy group which forms an amide bond by a reaction with amine and other acidic functional groups (namely, a carboxy group or an esterified group thereof, a phenolic hydroxyl group or a group of which the hydrogen atom was substituted by a substituent).

For example, it is an organic group having a structure corresponding to structures other than that of the carboxy group of tetracarboxylic dianhydride or dicarboxylic acid and an acidic functional group. As for $X_1$, it is preferable that an aromatic ring be generally included and that the carboxy group and other acidic functional groups be directly bonded to the aromatic ring.

As for the tetracarboxylic dianhydride, pyromellitic acid dianhydride, 3,3',4,4'-biphenyl tetracarboxylic dianhydride, 2,3,3',4'-biphenyl tetracarboxylic dianhydride, 2,2',3,3'-biphenyl tetracarboxylic dianhydride, 3,3',4,4'-benzophenone tetracarboxylic dianhydride, 2,2',3,3'-benzophenone tetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, 1,2,3,4-cyclopentane tetracarboxylic dianhydride, 2,2-bis(4-(4-aminophenoxy)phenyl)propane, 1,2,5,6-naphthalene tetracarboxylic dianhydride, 2,3,6,7-naphthalene tetracarboxylic dianhydride, 2,3,5,6-pyridine tetracarboxylic dianhydride, 3,4,9,10-perylene tetracarboxylic dianhydride, 3,3',4,4'-tetraphenylsilane tetracarboxylic dianhydride, 2,2-bis(3,4-dicarboxyphenyl)hexafluoropropane dianhydride, N,N'-(5,5'-(1,1,1,3,3,3-hexafluoropropane-2,2-diyl)bis(2-hydroxy-1,5-phenylene))bis(1,3-dioxo-1,3-dihydrobenzofuran-5-carboxyimide) or the like can be given. These can be used singly or in combination of two or more. The tetracarboxylic dianhydride is not limited to those mentioned above.

Of the above-mentioned tetracarboxylic dianhydrides, pyromellitic acid dianhydride, 3,3',4,4'-biphenyl tetracarboxylic dianhydride, 2,3,3',4'-biphenyl tetracarboxylic dianhydride, 2,2',3,3'-biphenyl tetracarboxylic dianhydride, 3,3',4,4'-benzophenone tetracarboxylic dianhydride, 2,2',3,3'-benzophenone tetracarboxylic dianhydride, bis(3,4-dicarboxyphenyl)ether dianhydride, 2,2-bis(3,4-dicarboxyphenyl)hexafluoropropane dianhydride, N,N'-(5,5-(1,1,1,3,3,3-hexafluoropropane-2,2-diyl)bis(2-hydroxy-1,5-phenylene))bis(1,3-dioxo-1,3-dihydrobenzofuran-5-carboxyimide) are preferable in respect of obtaining excellent physical properties, i.e. high heat resistance, of a film.

As the above-mentioned dicarboxylic acid, 2-fluoroisophthalic acid, 5-fluoroisophthalic acid, 3-fluorophthalic acid, 4-fluorophthalic acid, 2,4,5,6-tetrafluoroisophthalic acid, 3,4,5,6-tetrafluorophthalic acid, 4,4'-hexafluoroisopropylidene diphenyl-1,1'-dicarboxylic acid, perfluorosuberic acid, 2,2'-bis(trifluoromethyl)-4,4'-biphenylene dicarboxylic acid, terephthalic acid, isophthalic acid, 4,4'-oxydiphenyl-1,1'-dicarboxylic acid or the like can be given, for example. They can be used singly or in combination of two or more. The dicarboxylic acid is not limited to those mentioned above.

In addition, derivatives of these acids, various dicarboxylic dihalides (dichloride), for example, can be used.

Of the above-mentioned dicarboxylic acid and the derivatives thereof, terephthalic acid, isophthalic acid, 4,4'-oxydiphenyl-1,1'-dicarboxylic acid and derivatives thereof are preferable in respect of obtaining excellent physical properties, i.e. high heat resistance, of a film. Of them, 4,4'-oxydiphenyl-1,1'-dicarboxylic acid and its derivatives (for example, 4,4'-oxydiphenyl-1,1'-dicarboxylic dihalide) are preferable.

In order to adjust the alkali solubility, the above-mentioned dicarboxylic acids may have an acidic functional group having alkali solubility.

As a dicarboxylic acid having an acidic functional group, 4,4'-(5,5'-(1,1,1,3,3,3-hexafluoropropane-2,2-diyl)bis(2-hydroxy-1,5-phenylene))bis(azandiyl)bis(oxomethylene) dibenzoic acid, 4,4'-(5,5'-(propane-2,2-diyl)bis(2-hydroxy-1,5-phenylene))bis(azandiyl)bis(oxomethylene)dibenzoic acid, 4,4'-(3,3'-dihydroxybiphenyl-4,4'-diyl)bis(azandiyl)bis(oxomethylene)dibenzoic acid, 4,4'-(4,4'-sulfonylbis(2-hydroxy-1,4-phenylene))bis(azandiyl)bis(oxomethylene) dibenzoic acid, 4,4'-(6,6'-oxybis(2-hydroxy-1,6-phenylene))bis(azandiyl)bis(oxomethylene)dibenzoic acid, 4,4'-(6,6'-(propane-2-diyl)bis(2-hydroxy-1,6-phenylene))bis(azandiyl)bis(oxomethylene)dibenzoic acid, 4,4'-(4-hydroxy-1,3-phenylene)bis(azandiyl)bis(oxomethylene) dibenzoic acid, 4,4'-(2,5-dihydroxy-1,4-phenylene)bis(azandiyl)bis(oxomethylene)dibenzoic acid or the like can be given. They can be used singly or in combination of two or more. The dicarboxylic acid is not limited to those mentioned above.

Of the above-mentioned dicarboxylic acid having an acidic functional group, 4,4'-(5,5'-(1,1,1,3,3,3-hexafluoropropane-2,2-diyl)bis(2-hydroxy-1,5-phenylene))bis(azandiyl)bis(oxomethylene)dibenzoic acid, 4,4'-(5,5'-(propane-2,2-diyl)bis(2-hydroxy-1,5-phenylene))bis(azandiyl)bis(oxomethylene)dibenzoic acid, 4,4'-(3,3'-dihydroxybiphenyl-4,4'-diyl)bis(azandiyl)bis(oxomethylene)dibenzoic acid, 4,4'-(4,4'-sulfonylbis(2-hydroxy-1,4-phenylene))bis(azandiyl)bis(oxomethylene)dibenzoic acid, 4,4'-(6,6'-oxybis(2-hydroxy-1,6-phenylene))bis(azandiyl)bis(oxomethylene)dibenzoic acid, 4,4'-(4-hydroxy-1,3-phenylene)bis(azandiyl)bis(oxomethylene)dibenzoic acid are preferable in respect of obtaining excellent physical properties, i.e. high heat resistance, of a film.

Further, tricarboxylic acid such as trimellitic acid or its anhydride can be used.

The organic group having 2 to 8 valences of $Y_1$ in the formula (I) is an organic group corresponding to a structure of a part excluding the two amino groups and the acidic functional group in diamine and/or diamine having an acidic functional group, for example.

As the above-mentioned diamine, 4,4'-diaminodiphenyl ether, 4,4'-diaminodiphenyl methane, 4,4'-diaminodiphenyl sulfone, 4,4'-diamino diphenyl sulfide, m-phenylenediamine, p-phenylenediamine, 1,5-naphthalene diamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 2,2',3,3'-tetraethyl-4,4'-diaminobiphenyl, 2,2'-dimethoxy-4,4'-diaminobiphenyl, 3,3'-dimethoxy-4,4'-diaminobiphenyl, 2,2'-dihydroxy-4,4'-diaminobiphenyl, 3,3'-dihydroxy-4,4'-diaminobiphenyl, 2,2'-di(trifluoromethyl)-4,4'-diaminobiphenyl or the like can be given. They are used singly or in combination of two or more.

The diamine is not limited to those mentioned above.

Of the above-mentioned diamines, 4,4'-diaminodiphenyl ether, m-phenylenediamine, p-phenylenediamine, bis(4-aminophenoxy)biphenyl, 2,2'-dimethyl-4,4'-diaminobiphenyl and 3,3'-dimethyl-4,4'diaminobiphenyl are preferable in respect of obtaining excellent physical properties, i.e. high heat resistance, of a film.

In order to adjust the alkali solubility, the above-mentioned diamine may have an acidic functional group having alkali solubility.

As the diamine having an acidic functional group, one having one or more carboxy group such as 2,4-diaminobenzoic acid, 3,5-diaminobenzoic acid, 3,3'-diaminobiphenyl-5,5'-dicarboxylic acid, 4,4'-diaminodiphenylether-5,5'-dicarboxylic acid, 4,4'-diaminodiphenylmethane-5,5'-dicarboxylic acid, 4,4'-diaminodiphenylsulfone-5,5'-dicarboxylic acid, 4,4'-diaminodiphenylsulfide-5,5'-dicarboxylic acid or isomers thereof or one having a phenol group such as 4,4'-diamino-3,3'-dihydroxybiphenyl, 2,2-bis(3-amino-4-hydroxyphenyl)propane, 2,2-bis(3-amino-4-hydroxyphenyl)hexafluoropropane, oxybis(3-amino-4-hydroxyphenyl), bis(3-amino-4-hydroxyphenyl)sulfone, 2,4-diaminophenol, 1,4-diamino-2,5-dihydroxybenzene, N,N'-(4-aminophenylcarbonyl)-3,3'-dihydroxybiphenyl, N,N'-(3-aminophenylcarbonyl)-3,3'-dihydroxybiphenyl, N,N'-(4-aminophenylcarbonyl)-2,2-bis(3-amino-4-hydroxyphenyl)hexafluoropropane, N,N'-(3-aminophenylcarbonyl)-2,2-bis(3-amino-4-hydroxyphenyl)hexafluoropropane, N,N'-(4-aminophenylcarbonyl)-2,2-bis(3-amino-4-hydroxyphenyl)propane, N,N'-(3-aminophenylcarbonyl)-2,2-bis(3-amino 4-hydroxyphenyl)propane, N,N'-(4-aminophenylcarbonyl)-oxybis(3-amino-4-hydroxyphenyl), N,N'-(3-aminophenylcarbonyl)-oxybis(3-amino-4-hydroxyphenyl), N,N'-(4-aminophenylcarbonyl)-bis(3-amino-4-hydroxyphenyl)sulfone, N,N'-(3-aminophenylcarbonyl)-bis(3-amino-4-hydroxyphenyl)sulfone, N,N'-(4-aminophenylcarbonyl)-2,4-diaminophenol, N,N'-(3-aminophenylcarbonyl)-2,4-diaminophenol, N,N'-(4-aminophenylcarbonyl)-1,4-diamino-2,5-dihydroxybenzene, and N,N'-(3-aminophenylcarbonyl)-1,4-diamino-2,5-dihydroxybenzene can be given. They are used singly or in combination of two or more. The diamine is not limited to those mentioned above.

Of the diamine having an acidic functional group as mentioned above, 3,5-diaminobenzoic acid, and one having a phenol group, such as 4,4'-diamino-3,3'-dihydroxybiphenyl, 2,2-bis(3-amino-4-hydroxyphenyl)propane, 2,2-bis(3-amino-4-hydroxyphenyl)hexafluoropropane, oxybis(3-amino-4-hydroxyphenyl), bis(3-amino-4-hydroxyphenyl)sulfone, 2,4-diaminophenol, 1,4-diamino-2,5-dihydroxybenzene, N,N'-(4-aminophenylcarbonyl)-3,3'-dihydroxybiphenyl, N,N'-(3-aminophenylcarbonyl)-3,3'-dihydroxybiphenyl, N,N'-(4-aminophenylcarbonyl)-2,2-bis(3-amino-4-hydroxyphenyl)hexafluoropropane, N,N'-(3-aminophenylcarbonyl)-2,2-bis(3-amino-4-hydroxyphenyl)hexafluoro propane, N,N'-(4-aminophenylcarbonyl)-2,2-bis(3-amino-4-hydroxyphenyl)propane, N,N'-(3-aminophenylcarbonyl)-2,2-bis(3-amino-4-hydroxyphenyl)propane, N,N'-(4-aminophenylcarbonyl)-oxybis(3-amino-4-hydroxyphenyl), N,N'-(3-aminophenylcarbonyl)-oxybis(3-amino-4-hydroxyphenyl), N,N'-(4-aminophenylcarbonyl)-bis(3-amino-4-hydroxyphenyl)sulfone and N,N'-(3-aminophenylcarbonyl)-bis(3-amino-4-hydroxyphenyl)sulfone, are preferable in respect of obtaining excellent alkali-developable properties.

As for the component (a), by introducing into $R_1$ a functional group as a monovalent organic group other than a hydrogen atom, solubility at the time of development can be controlled, whereby pattern processing using a light reaction becomes possible. Further, by partially having these functional groups, and remaining a hydrogen atom as $R_1$, alkali solubility can be controlled.

As the method for introducing into $R_1$ a functional group as the monovalent organic group in the formula (I), a method in which introduction is conducted through an ether bond or an ester bond can be given. Specifically, an addition reaction utilizing a deoxygenation-halogenation reaction in which a halogen compound or an acid halide compound having as a substituent is allowed to react with a group in which $R_1$ is a hydrogen atom, an addition reaction with vinyl ether or the like can be given.

As the organic group having 1 to 20 carbon atoms of $R_1$, an organic group such as methyl, ethyl, propyl, isopropyl, n-butyl, s-butyl, t-butyl, cyclopropenyl, cyclobutyl, cyclopentyl, cyclohexyl, cyclohexylmethyl, cyclohexenyl, norbonyl, norbornenyl, adamantyl, benzyl, p-nitrobenzyl, trifluoromethyl, methoxyethyl, ethoxyethyl, methoxymethyl, ethoxymethyl, methoxyethoxymethyl, benzoxymethyl, tetra-hydropyranyl, ethoxytetrahydropyranyl, tetrahydrofuranyl, 2-trimethylsilylethoxymethyl, trimethylsilyl, t-butyldimethylsilyl, 3-oxocyclohexyl, 9-fluorenylmethyl and methylthiomethyl can be given.

As the organic group having 1 to 20 carbon atoms of $R_1$, a functional group obtained by reacting a carboxy group bonding to $X_1$ or $Y_1$ with a compound such as allyl alcohol, 2-methyl-2-propene-1-ol, crotyl alcohol, 3-butene-1-ol, 3-butene-2-ol, 3-methyl-2-butene-1-ol, 2-methyl-3-butene-1-ol, 3-methyl-3-butene-1-ol, 2-methyl-3-butene-2-ol, 2-pentene-1-ol, 4-pentene-1-ol, 3-pentene-2-ol, 4-pentene-2-ol, 1-pentene-3-ol, 4-methyl-3-pentene-1-ol, 3-methyl-1-pentene-3-ol, 2-hexene-1-ol, 3-hexene-1-ol, 4-hexene-1-ol, 5-hexene-1-ol, 1-hexene-3-ol, 1-heptane-3-ol, 6-methyl-5-heptane-2-ol, 1-octane-3-ol, citronellol, 3-nonene-1-ol, 5-decane-1-ol, 9-decane-1-ol, 7-decane-1-ol, 1,4-pentadiene-3-ol, 2,4-hexadiene-1-ol, 1,5-hexadiene-3-ol, 1,6-heptadiene-4-ol, 2,4-dimethyl-2,6-heptadiene-1-ol, nerol, geraniol, linalool, 2-cyclohexene-1-ol, 3-cyclohexene-1-methanol, isopulegol, 5-norbornene-2-ol, 5-norbornene-2-methanol, ethylene glycol vinyl ether, 1,4-butanediolvinyl ether, 1,6-hexanediolvinyl ether, diethylene glycol vinyl ether, 2-hydroxyethyl acrylate, 3-hydroxypropyl acrylate, 2-hydroxyethyl methacrylate, 3-hydroxypropyl methacrylate, 4-hydroxybutyl acrylate, 4-hydroxybutyl methacrylate, pentaerythritoldiacrylate monostearate, pentaerythritol triacrylate, caprolactone-2-(methacryloyloxy)ethylester, dicaprolactone-2-(methacryloyloxy)ethylester, 2-hydroxy-3-phenoxypropylacrylate, and 2-hydroxy-3-phenoxypropylmethacrylate can be given. The organic group is not limited to those mentioned above. If the terminal of the polymer has an acidic functional group, it is possible to introduce these functional groups.

Of the above-mentioned organic groups having 1 to 20 carbon atoms, methyl, ethyl, propyl, isopropyl, n-butyl, s-butyl, t-butyl, methoxyethyl, ethoxyethyl, methoxymethyl, ethoxymethyl, methoxyethoxymethyl, tetrahydropyranyl, ethoxytetrahydropyranyl and tetrahydrofuranyl are preferable in respect of good control of the solubility.

$R_2$ in the formula (I) is preferably a derivative having 1 to 20 carbon atoms, and as $R_2$, the same groups as those exemplified for $R_1$ can be given. If $R_2$ is the same functional group as $R_1$, control of solubility at the time of development and/or pattern processing utilizing light reaction become possible.

Further, due to the partial presence of these functional groups, alkali solubility can also be controlled. In addition, if the terminal of a polymer in the component (a) has an acidic functional group, it is possible to introduce the functional group.

In the component (a), the both terminals may be the same or different. For example, the terminal is an amine functional group, a substituent induced therefrom, an acidic functional group, and a substituent induced therefrom.

If the amine functional group at the terminal is a primary amine, stability of a photosensitive resin composition may be deteriorated due to the occurrence of a side reaction. Therefore, in respect of obtaining stability as a photosensitive resin composition, it is preferred that, of the two hydrogen atoms on the amine functional group, at least one be substituted by other atoms or other functional groups. In order to obtain sufficient stability, it is more preferred that the substitution ratio of the above-mentioned other atoms or other functional groups be 30% to 100%.

If the terminal of the component (a) is a substituent induced from an amine functional group, as the substituent on nitrogen induced from an amine functional group, amide, imide, carbamate, sulfonyl, sulphenyl, phosphinyl and alkylsilyl can be given. Of these, amide, imide, carbarnate and sulfonyl are preferable in respect of obtaining more excellent properties of a cured resin.

The end of the component (a) is preferably a hydrogen atom or a substituent represented by the following formula (VIII) as the substituent on nitrogen induced from the above-mentioned amine functional group.

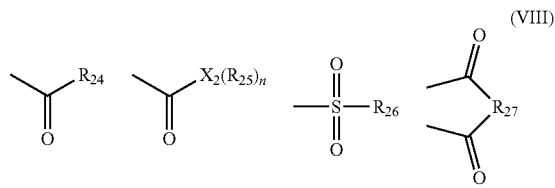

wherein $R_{24}$ to $R_{26}$ is a monovalent organic group, preferably an organic group having 1 to 20 carbon atoms. $R_{27}$ is a divalent organic group. $X_2$ is an oxygen atom, a sulfur atom or a nitrogen atom. If $X_2$ is an oxygen atom or a sulfur atom, n is 1, and if $X_2$ is a nitrogen atom, n is 2.

As the monovalent organic group of $R_{24}$ to $R_{26}$, methyl, ethyl, propyl, isopropyl, n-butyl, s-butyl, t-butyl, cyclopropenyl, cyclobutyl, cyclopentyl, cyclohexyl, cyclohexylmethyl, cyclohexenyl, norbonyl, norbornenyl, adamantyl, benzyl, p-nitrobenzyl, trifluoromethyl, methoxyethyl, ethoxyethyl, methoxymethyl, ethoxymethyl, methoxyethoxymethyl, benzoxymethyl, ethoxytetrahydropyranyl, tetrahydrofuranyl, 2-trimethylsilylethoxymethyl, trimethylsilyl, t-butyldimethylsilyl, 3-oxocyclohexyl, 9-fluorenylmethyl, phenyl, tolyl, xylyl, 9,10-dihydroanthranyl, trimethylphenyl, pentamethylphenyl, biphenyl, terphenyl, quarterphenyl, dimethylbiphenyl, naphthalenyl, methylnaphthalenyl, fluorenyl, fluorophenyl, fluorobiphenyl, isopropylidene biphenyl, tetrafluoroisopropylidene biphenyl, benzyl phenyl ether, phenyl ether, phenoxytolyl, methoxybiphenyl, dimethoxybiphenyl, methoxynaphthalenyl, dimethoxynaphthalenyl and nitrophenyl can be given, for example.

As the divalent organic group of $R_{27}$, a divalent organic group corresponding to methane, ethane, propane, isopropane, dimethylmethane, butane, cyclopropane, cyclobutane, cyclopentane, cyclohexane, methylcyclohexane, norbornane, adamantane, isopropylidene dicyclohexane, methoxymethane, methoxyethane, ethoxyethane, methoxyethoxymethane, benzoxymethane, tetrahydrofuran, benzene, toluene, cumene, diphenylmethane, xylene, 9,10-dihydroanthracene, mesitylene, hexamethylbenzene, biphenyl, terphenyl, triphenylbenzene, quarter phenyl, dimethyl biphenyl, azulene, naphthalene, methylnaphthalene, anthracene, fluorene, fluorobenzene, fluorobiphenyl, isopropylidene biphenyl, tetrafluoroisopropylidene biphenyl, anisole, benzylphenyl ether, phenyl ether, phenoxy toluene, tolylether, methoxy biphenyl, dimethoxybiphenyl, methoxynaphthalene, dimethoxynaphthalene and nitrobenzene can be given, for example. The divalent organic group is not necessarily limited to those mentioned above.

As the acidic functional group and/or the substituent induced therefrom at the terminal in the component (a), a group represented by —COOR$_1$ or —OR$_2$ in the formula (I) can be given.

The molecular weight of the component (a) is not particularly restricted. However, the weight average molecular weight is preferably 5000 to 80000 in terms of standard polystyrene.

The molecular weight can be measured by the gel permeation chromatography (GPC) method, and can be calculated by using a standard polystyrene standard curve.

The component (a) is preferably a polyimide precursor, a polybenzoxazole precursor, a copolymer thereof and a mixture thereof which is obtained by using, as the main raw materials of a polymer, tetracarboxylic dianhydride, dicarboxylic acid, the compounds in which a further acidic functional group is contained therein or derivatives thereof, and diamine or compounds in which a further acidic functional group is contained therein. In respect of mechanical properties of a heat cured film (stretchability, elastic modulus, or the like), a polybenzoxazole precursor is preferable.

The component (a) can be prepared by polymerizing tetracarboxylic dianhydride, dicarboxylic acid and/or dicarboxylic acid having an acidic functional group with diamine and/or diamine having an acidic functional group.

For example, a polyimide precursor as the component (a) can be prepared by polymerizing tetracarboxylic dianhydride with diamine and/or diamine having an acidic functional group. Similarly, a polybenzoxazole precursor as the component (a) can be prepared by polymerizing dicarboxylic acid which has been subjected to active esterification and/or dicarboxylic acid having an acidic functional group, and the diamine which has a phenolic acidic functional group. Moreover, by copolymerizing tetracarboxylic dianhydride, dicarboxylic acid and/or dicarboxylic acid having an acidic functional group which has been subjected to active esterification with diamine and/or diamine having an acidic functional group, a copolymer of a polyimide/polybenzoxazole precursor can be prepared.

The component (b) is a compound having two or more oxetanyl groups in one molecule. For example, the component (b) is a compound having 2 to 4 oxetanyl groups. The oxetanyl group in the component (b) has a 4-membered ether ring structure. The component (b) may be either 2-substituted or 3-substituted. In respect of mechanical properties of a heat cured film (stretchability, elastic modulus, or the like), the component (b) preferably contains 2 to 4 oxetanyl groups in one molecule, more preferably 2 oxetanyl groups.

The component (b) is an oxetane compound which reacts, i.e. cross-links, with the polymer (component (a)) during the process in which a heat treatment is conducted after a photosensitive resin composition has been applied, exposed to light and developed. At this time, it is preferred that the component (b) be reacted with the component (a) without using other catalysts. Alternatively, during the process in which a heat treatment is conducted, the component (b) itself is polymerized, whereby mechanical properties (stretchability, elastic modulus, or the like), resistance to chemicals, adhesiveness with a substrate, thermal properties or the like of a heat cured film can be improved.

It is preferred that the component (b) be subjected to addition reaction with a phenolic hydroxy group in the component (a) during a process in which a heat treatment is conducted after coating, exposure to light and development.

In respect of mechanical properties (stretchability, elastic modulus, or the like) and thermal properties (glass transition temperature, thermal expansion coefficient or the like), it is preferred that the component (b) be a compound represented by the following formula:

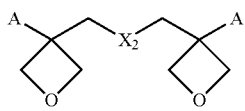

wherein $X_2$ is a single bond or a divalent organic group containing at least one of an alkylene group, an aromatic ring, an oxygen atom and a sulfur atom, and A is an alkyl group having 1 to 10 carbon atoms.

In respect of thermal properties (glass transition temperature, thermal expansion coefficient), it is more preferred that component (b) be a compound represented by the following formula:

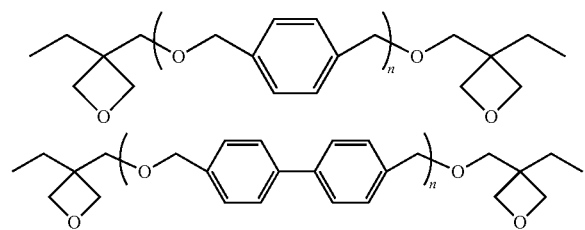

wherein n is an integer of 0 to 3. The component (b) may be a mixture of compounds which differ in n.

As the component (b), 1,4-bis{[(3-ethyloxetane-3-yl)methoxy]methyl}benzene, 3,3'-[[4,4'-oxybis(methylene)bis(4,1-phenylene)bis(methylene)]bis(oxy)bis(methylene)bis(3-ethyloxetane), 1,4-bis{(4-{[(3-ethyloxetane-3-yl)methoxy]methyl}benzyloxy)methyl}benzene, 3-ethyl-3-{[3-(ethyloxetane-3-yl)methoxy]methyl}oxetane, bis[1-ethyl(3-oxetanyl)]methylether, 4,4'-bis[(3-ethyl-3-oxetanyl)methoxymethyl]biphenyl, 4,4'-bis(3-ethyl-3-oxetanyl-methoxy)biphenyl, ethylene glycol bis(3-ethyl-3-oxetanyl-methyl)ether, diethylene glycol-bis(3-ethyl-3-oxetanylmethyl)ether, bis(3-ethyl-3-oxetanylmethyl) diphenoate, trimethylolpropane tris(3-ethyl-3-oxetanylmethyl)ether, pentaerythritol tetrakis(3-ethyl-3-oxetanylmethyl)ether, poly[[3-[(3-ethyl-3-oxetanyl)methoxy]propyl]silasesguioxane] derivative, oxetanyl silicate, phenol novolac type oxetane, 1,3-bis[(3-ethyl-oxetane-3-yl)methoxy]benzene or the like can be given. The component (b) is not necessarily limited to those mentioned above. They may be used singly or in combination of two or more. Of these, in respect of developability, 1,4-bis{[(3-ethyloxetane-3-yl)methoxy]methyl}benzene, and 3-ethyl-3-{[3-(ethyloxetane-3-yl)methoxymethyl}oxetane are preferably used.

The component (b) is contained preferably in an amount of 1 to 40 parts by weight, more preferably 5 to 30 parts by weight, and further preferably 5 to 15 parts by weight, relative to 100 parts by weight of the component (a). If the amount of the component (b) is larger than 40 parts by weight, resistance to chemicals is lowered, and if the amount of component (b) is smaller than 1 part by weight, a cured film may become brittle.

In order to not to prevent effects of the component (b) to increase the resistance to chemicals, it is preferred that a methylol group-containing compound, an epoxy group-containing compound or the like be not substantially contained. The "substantially" means that the amount contained is 5% or less.

A diazonaphthoquinone compound as the component (c) is a photosensitizer and has a function of generating an acid by exposure to active light. Due to the presence of the component (c), solubility in an aqueous alkaline solution of a light-irradiated part of a resin film obtained from the composition of the invention can be increased. A naphthoquinonediazide compound is preferably o-naphthoquinonediazide compound.

The above-mentioned naphthoquinonediazide compound can be obtained by subjecting naphthoquinone sulphenyl chloride and a polyhydroxy compound to a condensation reaction according to a known method, for example. For example, it can be obtained by reacting a polyhydroxy compound and 1,2-naphthoquinonodiozide-4-sulfonylchloride or 1,2-naphthoquinonediazide-5-sulfonylchloride in the presence of a basic catalyst such as triethylamine.

As the polyhydroxy compound serving as the ballast of a sensitizer, hydroquinone, resorcinol, pyrogallol, bisphenol A, bis(2-hydroxyphenyl)methane, bis(4-hydroxyphenyl)methane, 2-hydroxyphenyl-4'-hydroxyphenylmethane, 2,2-bis(4-hydroxyphenyl)hexafluoropropane, 2,3,4-trihydroxybenzophenone, 2,34,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 2-(4-hydroxyphenyl)-2-[4-[1,1-bis(4-hydroxyphenyl)ethyl]phenyl]propane, 4b,5,9b,10-tetrahydro-1,3,6,8-tetrahydroxy-5,10-dimethylindeno[2,1-a]indene, tris(4-hydroxyphenyl)methane, 1,1,1-tris(4-hydroxyphenyl)ethane or the like can be given. The polyhydroxy compound is not necessarily limited to those mentioned above.

The component (c) is contained preferably in an amount of 1 to 50 parts by weight, more preferably 1 to 30 parts by weight, and further preferably 5 to 20 parts by weight, relative to 100 parts by weight of the component (a).

A solvent as the component (d) dissolves the components (a), (b) and (c) or the like as mentioned above to form a vanish-like product.

As the solvent used, N-methyl-2-pyrrolidone, γ-butylolactone, N,N-dimethylacetoamide, dimethylsulfoxide, 2-methoxyethanol, diethylene glycol diethylether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol acetate, cyclohexanone, cyclopentanone, tetrahydrofuran or the like can be given. They are used either singly or in mixture.

In respect of obtaining an appropriate film thickness, the component (d) is contained preferably in an amount of 100 to 350 parts by weight, more preferably 100 to 250 parts by weight, further preferably 100 to 200 parts by weight relative to 100 parts by weight of the component (a).

The positive photosensitive resin composition of the invention can be developed in a general-purpose developer such as tetramethylammonium hydroxide and choline, and has high resistance to strong alkali.

In the composition of the invention, the total amounts of the components (a) to (c) is preferably 70 wt % or more, more preferably 80 wt % or more, and further preferably 90 wt % or more relative to the total amount of the composition. The composition of the invention may contain, in addition to these components, substances which will not substantially impair the basic properties of the invention, such as the following additives.

The composition of the invention may contain, in addition to the components (a) to (d) mentioned above, additives such as an adhesiveness imparting agent, a surfactant, a leveling agent, a cross-linking agent or the like.

An adhesiveness imparting agent can improve adhesiveness of a cured film obtained from the composition of the invention with a substrate. As the adhesiveness imparting agent, an organic silane compound, an aluminum chelating compound or the like can be given.

As the organic silane compound, vinyltriethoxysilane, γ-glycidoxypropyltriethoxysilane, γ-methacryloxypropyltrimethoxysilane, propylurea triethoxysilane, methylphenylsilanediol, ethylphenylsilanediol, n-propylphenylsilanediol, isopropylphenylsilanediol, n-butylphenylsilanediol, isobutylphenylsilanediol, tert-butylphenylsilanediol, diphenylsilanediol, ethyl methylphenylsilanol, n-propylmethylphenylsilanol, isopropylmethylphenylsilanol, n-butylmethylphenylsilanol, isobutylmethylphenylsilanol, tert-butyl methylphenylsilanol, ethyl-n-propylphenylsilanol, ethylisopropylphenylsilanol, n-butylethylphenylsilanol, isobutylethylphenylsilanol, tert-butylethylphenylsilanol, methyldiphenyl silanol, ethyldiphenylsilanol, n-propyldiphenylsilanol, isopropyldiphenylsilanol, n-butyldiphenylsilanol, isobutyldiphenylsilanol, tert-butyldiphenylsilanol, phenylsilanetriol, 1,4-bis(trihydroxsilyl)benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene, 1,4-bis(dibutylhydroxysilyl)benzene or the like can be given, for example.

As the above-mentioned aluminum chelating compound, tris(acetylacetonate)aluminum, acetylacetate aluminum diisopropylate or the like can be given, for example.

If an adhesiveness imparting agent is contained, the content thereof is preferably 0.01 to 20 parts by weight, more preferably 0.1 to 10 parts by weight, relative to 100 parts by weight of the component (a).

A surfactant or a leveling agent can prevent striation (unevenness of film thickness), for example, or can improve the developability of the composition of the invention.

As the above-mentioned surfactant or leveling agent, polyoxyethylene lauryl ether, polyoxyethylene stearyl ether, polyoxyethylene oleyl ether, polyoxyethylene octylphenol ether, or the like can be given, for example. Moreover, as the commercial products of a surfactant or a leveling agent, Megafac F171, F173 and R-08 (manufactured by Dainippon Ink & Chemicals, Inc.), Fluorad FC430 and FC431 (manufactured by Sumitomo 3M, Inc.), organosiloxane polymer KP341, KBM303, KBM403 and KBM803 (manufactured by Shin-Etsu Chemical Co., Ltd.), or the like can be given.

In the invention, a dissolution inhibitor which is a compound which inhibits the solubility of the base resin as the component (a) in an aqueous alkaline solution may further be contained as the component (e). However, the component (e) does not contain a diazonaphthoquinone compound.

No specific restrictions are imposed on the component (e), as long as it can develop effects, before and after addition to a resin composition, of lowering the dissolution speed of a coating film formed on a substrate such as silicon wafer by spin coating of a varnish obtained by dissolving the component (a) alone or with the components (b) and (c) in an arbitral solvent.

An onium salt can be given as a preferable dissolution inhibitor. As examples of the onium salt, a diaryliodonium salt such as a diphenyliodonium salt, a di(alkylaryl)iodonium salt such as a di(t-butylphenyl)iodonium salt, a trialkylsulfonium salt such as a trimethylsulfonium salt, a dialkylmonoarylsulfonyl salt such as a dimethylphenylsulfonium salt, a diarylmonoalkyliodonium salt such as a diphenylmethylsulfonium salt and the like can be given. Since these onium salts are used as a dissolution inhibitor, it is preferable to select one which does not have an absorption in the wavelength region used for light exposure. An onium salt having absorption in the wavelength region, it may inhibit light reaction of the component (c), resulting in lowering in sensitivity.

In this respect, particularly preferable onium salts are diphenyliodonium nitrate, bis(p-tert-butylphenyl)iodonium nitrate, diphenyliodonium bromide, diphenyliodonium chloride, diphenyliodonium iodide or the like.

Due to the addition of the component (e), it is possible to adequately control the thickness of the remaining film or the development time. Therefore, a certain latitude is allowed for the permissible range of the added amount of other components, whereby the effects of each component can be conspicuous. The added amount of the component (e) is, in respect of the permissible range of the sensitivity and developing time, preferably 0.01 to 30 parts by weight, more preferably 0.01 to 20 parts by weight, further preferably 0.01 to 10 parts by weight, relative to 100 parts by weight of the component (a) (base resin).

The composition of the invention may essentially be composed of the components (a) to (d), and optionally the component (e), as mentioned above. The composition of the invention may consist of these components. The term "essentially" means that the composition is composed of mainly the components (a) to (d) and optionally the component (e), and can contain the above-mentioned additives in addition to these components.

Next, the method for producing a patterned cured film of the invention will be explained.

A patterned cured film can be formed by using the composition of the invention. In particular, a cured film obtained from the composition of the invention has excellent heat resistance and mechanical properties.

The method for producing a patterned cured film of the invention comprises a photosensitive resin formation step in which the composition of the invention is applied to a supporting substrate, followed by drying to form a photosensitive resin film; a development step in which the photosensitive resin film thus formed is exposed to light in a prescribed pattern; a development step in which the photosensitive resin film after light exposure is developed in an aqueous alkaline solution to obtain a patterned resin film; and a heat treatment step in which the patterned resin film is subjected to a heat treatment to obtain a patterned cured film.

As the support substrate to which the composition of the invention is applied, silicon wafer, a metal substrate, a ceramic substrate, or the like can be given. Moreover, as the application method, the dipping method, the spray method, the screen-printing method, the rotational coating method, or the like can be given. The photosensitive resin coating film can be obtained by heating and drying the composition of the invention which has been applied to the supporting substrate adequately.

The resulting photosensitive resin coating film is exposed to active rays or chemical rays through a mask with a prescribed pattern.

As the active rays or chemical rays used for irradiation, a contact/proximity exposure apparatus using an ultrahigh pressure mercury lamp, a mirror projection exposure apparatus, an i-ray stepper, a g-ray stepper, other sources for ultraviolet rays or visible rays. X rays and electron beams can be used.

For the resin film after exposure, by removing the exposed part by dissolution using an aqueous alkaline solution, a desired positive pattern (patterned resin film) can be obtained. As the aqueous alkaline solution to be used as the developer, an aqueous solution of alkali metal hydroxide, such as potassium hydroxide and sodium hydroxide; quaternary ammonium hydroxide such as tetramethylammonium hydroxide, tetraethylammonium hydroxide and choline; and an aqueous amine solution such as ethanolamine, propylamine and ethylenediamine, or the like can be used.

After development, the film may be rinsed with water or a poor solvent if necessary.

As a rinsing liquid to be used, methanol, ethanol, isopropyl alcohol, benzene, toluene, xylene, methyl cellosolve, water or the like can be given, for example.

By heating the resulting patterned resin film, the solvent or the solvent and the sensitizer are removed, whereby a stable, highly-heat-resistant patterned cured film can be obtained.

The above-mentioned heating temperature is preferably 150 to 500° C., more preferably 200 to 400° C. When the heating temperature is less than 150° C., the mechanical properties and thermal properties of the film may be deteriorated. On the other hand, if the heating temperature exceeds 500° C., the mechanical properties and thermal properties of the film may be deteriorated.

Moreover, the heating time is preferably 0.05 to 10 hours. When the heating time is less than 0.05 hour, the mechanical properties and thermal properties of the film may be deteriorated. On the other hand, when the heating time exceeds 10 hours, the mechanical properties and thermal properties of the film may be deteriorated.

The patterned cured film composed of the composition of the invention can be used in an electronic component such as a semiconductor apparatus and a multilayer wiring plate. Specifically, the patterned cured film formed of the composition of the invention can be used in a surface protective layer or an interlayer insulating layer of a semiconductor apparatus, an interlayer insulting layer of a multilayer wiring plate or the like.

No specific restrictions are imposed on the electronic component of the invention, as far as it has a surface protective film layer and/or an interlayer insulating film layer formed by using the composition of the invention, and it may have various structures. As the electronic component, a semiconductor device, a multilayer wiring plate and various electronic devices are included.

The method for producing a patterned cured film of the invention and an electronic component provided with the patterned cured film of the invention will be explained with reference to the drawing taking as an example the steps for producing a semiconductor device having a patterned cured film. FIGS. 1 to 5 are schematic cross-sectional views explaining the steps of manufacturing a semiconductor device having a multilayer wiring structure. Each figure shows a series of steps from the first step to the fifth step.

In FIGS. 1 to 5, a semiconductor substrate 1 such as an Si substrate which has a circuit element (not shown) is covered with a protective film 2 such as a silicon oxide film, excluding the predetermined part of a circuit element. A $1^{st}$ conductor layer 3 is formed on the exposed circuit element. An interlayer insulating layer 4 is formed by spin coating or the like on the above-mentioned semiconductor substrate 1 (the first step, FIG. 1).

The interlayer insulating layer 4 can be formed by using the resin composition of the invention.

Figure 2:
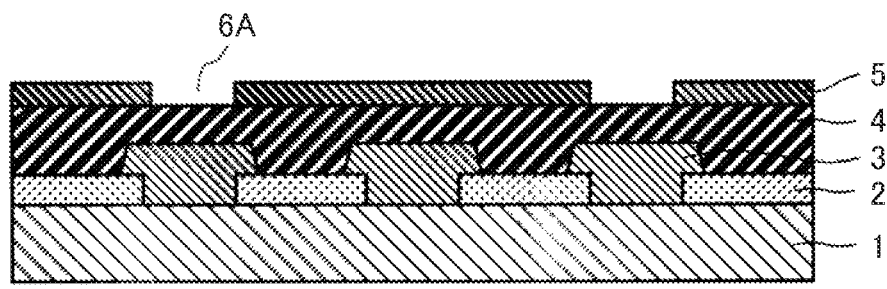
FIG. 2 is a schematic cross-sectional view explaining the steps of manufacturing a semiconductor device having a multilayer wiring structure according to one embodiment of the invention.
Figure 3:
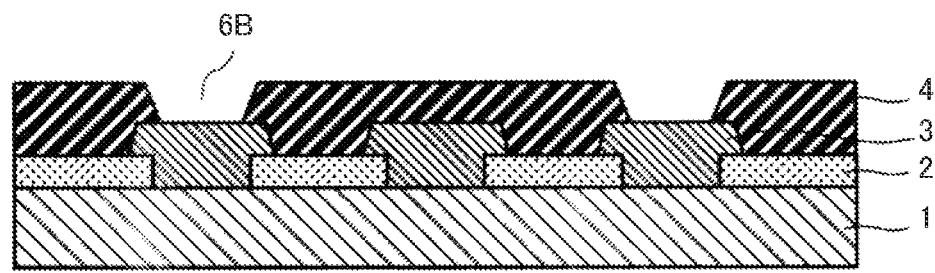
FIG. 3 is a schematic cross-sectional view explaining the steps of manufacturing a semiconductor device having a multilayer wiring structure according to one embodiment of the invention.

Next, a photosensitive resin layer 5 based on chlorinated rubber, phenol novolac or the like is formed by spin coating on the interlayer insulating layer 4 as a mask, and a window 6A is formed so that a predetermined part of the interlayer insulating layer 4 is exposed by known photolithographic technology (the second step, FIG. 2).

Subsequently, the interlayer insulating layer 4 exposing in this window 6A is selectively etched by dry etching using a gas such as oxygen and tetrofluorocarbon, whereby a window 6B is opened. Subsequently, the photosensitive resin layer 5 is completely removed by using an etching solution which corrodes only the photosensitive resin layer 5 without corroding the $1^{st}$ conductor layer 3 which is exposed in the window 6B (third step, FIG. 3).

Figure 4:
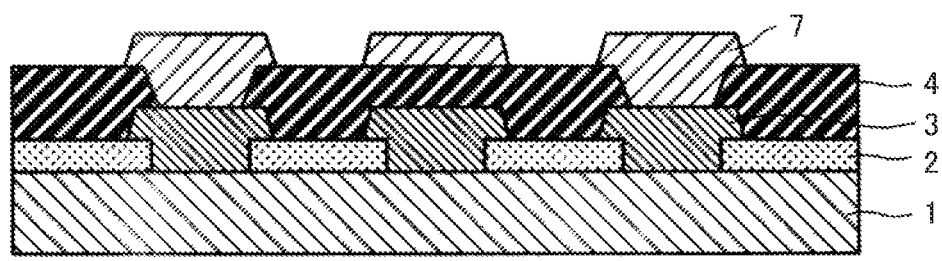
FIG. 4 is a schematic cross-sectional view explaining the steps of manufacturing a semiconductor device having a multilayer wiring structure according to one embodiment of the invention.

Further, by using a known photolithographic technology, a $2^{nd}$ conductor layer 7 is formed, whereby electrical connection with the $1^{st}$ conductor layer 3 is completely attained (the fourth step, FIG. 4). When forming a multilayer wiring structure of three or more layers, the above-mentioned steps are conducted repeatedly to form each layer.

Figure 5:
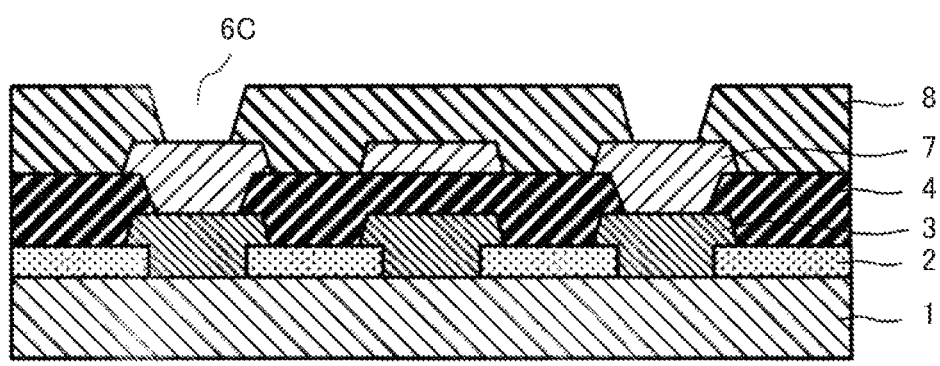
FIG. 5 is a schematic cross-sectional view explaining the steps of manufacturing a semiconductor device having a multilayer wiring structure according to one embodiment of the invention.

Subsequently, a surface protective film 8 is formed. In FIG. 5, the resin composition of the invention is applied by spin coating, followed by drying. After irradiating light through a mask having a pattern for forming a window 6C in a prescribed part, development is conducted in an aqueous alkaline solution to form a patterned resin film. Thereafter, this patterned resin film is heated to form a patterned cured film of a photosensitive resin serving as a surface protective film layer 8 (the fifth step, FIG. 5).

This surface protective film layer (patterned cured film) 8 protects the conductor layer from stress from outside, a rays or the like. The semiconductor device thus obtained has excellent reliability

EXAMPLES

The invention will be explained in more detail according to the following examples and comparative examples, which should not be construed as limiting the scope of the invention.

Synthesis Example 1

Synthesis of Polybenzoxazole Precursor 15.48 g (60 mmol) of 4,4'-diphenylether dicarboxylic acid and 90 g of N-methylpyrrolidone were placed in the 0.5 l-flask provided with a stirrer and a thermometer. After cooling the flask to 5° C., 23.9 g (120 mmol) of thionyl chloride was added dropwise, and the resulting mixture was allowed to react for 30 minutes, whereby a solution of 4,4'-diphenylether dicarboxylic acid chloride was obtained. Subsequently, 87.5 g of N-methylpyrrolidone was placed in a 0.5 l-flask provided with a stirrer and a thermometer. Then, 18.30 g (50 mmol) of bis(3-amino-4-hydroxyphenyl)hexafluoropropane and 2.18 g (20 mmol) of m-aminophenol were dissolved therein with stirring, followed by addition of 9.48 g (120 mmol) of pyridine. While keeping the temperature to 0 to 5° C., a solution of 4,4'-diphenylether dicarboxylic acid chloride was added dropwise for 30 minutes, and the resulting mixture was stirred for 30 minutes. The solution was put into 3 l of water and precipitates were collected and washed three times with pure water. Thereafter, the precipitates were dried under reduced pressure to obtain polyhydroxyamide having a hydroxyl group at its terminal (hereinafter referred to as Polymer I). The weight average molecular weight calculated by the GPC method (in terms of standard polystyrene) of polymer I was 23,400 and the degree of dispersion was 1.8.

Synthesis Example 2

Synthesis was conducted in the same manner as in Synthesis Example 1, except that m-aminophenol was not added. The weight average molecular weight calculated by the GPO method (in terms of standard polystyrene) of polyhydroxyamide having a carboxy group at its terminal was 17,600 and the degree of dispersion was 1.6.

Subsequently, 20 g of this polymer was placed in a 0.5 l-flask provided with a stirrer and a thermometer together with 100 g of N-methylpyrrolidone, and dissolved with stirring. While keeping the temperature to 0 to 5° C., 6.0 g of chloromethylethylether was added dropwise, followed dropwise addition of 6.0 g of triethylamine. The resulting mixture was stirred for 30 minutes. The solution was put into 2 l of water and precipitates were collected and washed three times with pure water. Thereafter, the precipitates were dried under reduced pressure to obtain polyhydroxyamide with an ethoxymethyl group being introduced at its terminal (hereinafter referred to as the polymer II). The introduction ratio of the ethoxymethyl group was obtained by $^1$H-NMR. As a result, 99% of the carboxy group at the terminal was converted into the ethoxymethyl group. Only 8% of the phenolic hydroxyl group in the molecule chain was substituted.

Synthesis Example 3

Synthesis was conducted in the same manner as in Synthesis Example 1, except that dodecanedioic acid was used instead of diphenylether dicarboxylic acid. The weight average molecular weight of the resulting polyhydroxyamide (hereinafter referred to as Polymer III) (in terms of standard polystyrene) was 29,500 and the degree of dispersion was 2.1.

Synthesis Example 4

20.16 g (66 mmol) of 3,3',4,4'-diphenylether tetracarboxylic dianhydride, 83.93 g of N-methylpyrrolidone and 7.81 g (130 mmol) of isopropyl alcohol and 0.30 g (1 mmol) of diazabicycloundecene were placed in a 0.2 l-flask provided with a stirrer and a thermometer. The resulting mixture was allowed to react by stirring at room temperature for 120 hours, whereby a N-methylpyrrolidone solution of a diisopropyl ester of 3,3',4,4'-diphenylether tetracarboxylic acid was obtained. Subsequently, 103.56 g of an N-methylpyrrolidone solution of a diisopropyl ester of 3,3',4,4'-diphenylether tetracarboxylic acid was placed in a flask, and the flask was cooled to 0° C. To the resulting mixture, 12.44 g (106 mmol) of thionyl chloride was added dropwise, and the resulting mixture was allowed to react for 30 minutes, whereby an N-pyrrolidone solution of 3,3',4,4'-diphenylethertetracarboxylic acid diisopropylester dichloride was obtained. Subsequently, 53.72 g of N-methylpyrrolidone was placed in a 0.5 l-flask provided with a stirrer and a thermometer. 25.63 g (70 mmol) of bis(3-amino-4-hydroxyphenyl)hexafluoropropane was added, and dissolved by stirring. Thereafter, 16.32 g of pyridine was added. While keeping the temperature to 0 to 5° C., 107.56 g of an N-methylpyrrolidone solution of 3,3',4,4'-diphenylethertetracarboxylic acid diisopropylester dichloride was added dropwise for 20 minutes, and the resulting mixture was stirred for 1 hour. The resulting solution was put in 3 litters of water, precipitates were collected, washed three times with pure water, and dried under reduced pressure to obtain a polyimide precursor (hereinafter referred to as Polymer IV). The weight average molecular weight thereof (in terms of standard polystyrene) was 28,000 and the degree of dispersion was 1.5.

Conditions of Measuring the Weight Average Molecular Weight by the GPC Method

Measuring device: Detector SPD-M20A, manufactured by Shimadzu Corp.

Pump: LC-20A, manufactured by Shimadzu Corp.

System controller: CBM-20A

Measurement conditions: Column Gelpack GL-S300MDT-5×2, manufactured by Hitachi Chemical Eluent: THF (tetrahydrofuran)/DMF (N,N-dimethylformamide)=1/1 (volume ratio) lithium bromide monohydrate (0.03 mol/L), phosphoric acid (0.06 mol/L)

Flow velocity: 1.0 mL/min, Detector: 190 to 800 nm (the molecular weight was calculated from a 270-nm chromatogram)

Measurement was conducted for a sample diluted with a solution obtained by dissolving 0.5 mg of the polymer in 1 mL of the solvent.

Examples 1 to 13 and Comparative Examples 1 to 3

Relative to 100 parts by weight of the polymer as the component (a), the components (b), (c) and (d) were mixed together with a solvent in an amount shown in Table 1, thereby to obtain a solution of the photosensitive resin composition.

In the table, BLO indicates γ-butyrolactone, PGMEA indicates propylene glycol monomethyl ether acetate, NMP indicates N-methylpyrrolidone, and BLO/PGMEA means that BLO and PGMEA were mixed in a weight ratio of 9:1. In the table, the added amount was indicated as part by weight per 100 weights part of the polymer. The amount of the solvent used is 150 parts by weight relative to 100 parts by weight of the polymer.

In Table 1, B1 to 4 C1 and 2 and D1 are the following compounds.

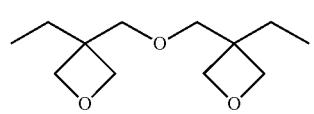

B1

-continued

B2
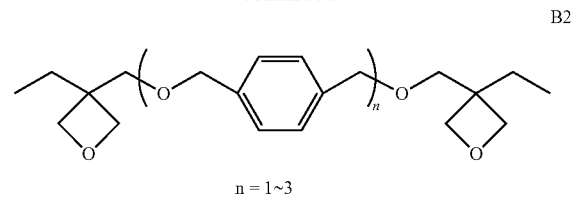
n = 1~3

B3
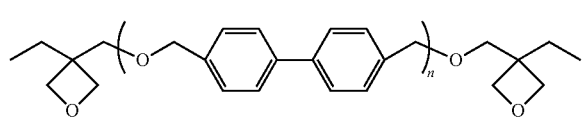

B4
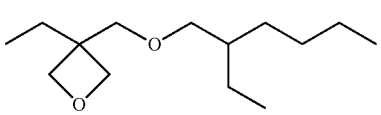

B5
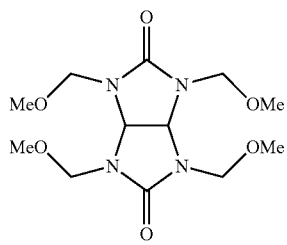

B6
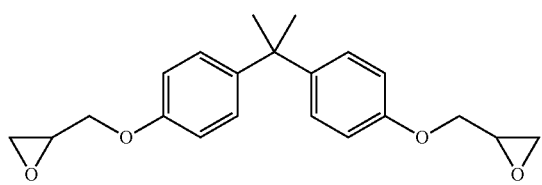

C1
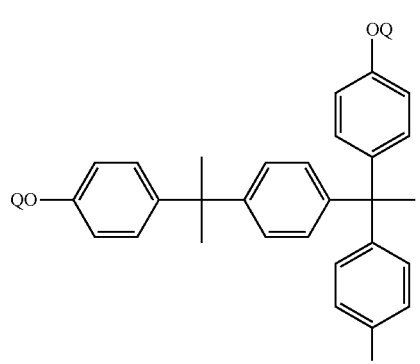

C2
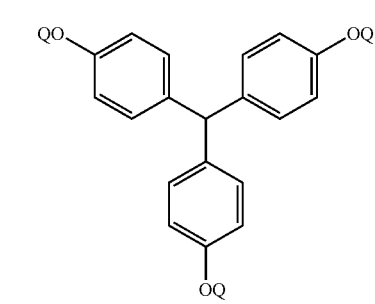

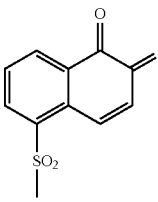

[Evaluation of Sensitivity and Resolution]

The composition was applied to silicon wafer by spin coating to form a coating film having a dry thickness of 7 to 12 µm. Thereafter, by using an ultrahigh pressure mercury lamp, the film was exposed to i rays of 100 to 1000 mJ/cm$^2$ through an interference filter. After the exposure, by using an aqueous 2.38 wt % solution of tetramethylammonium hydroxide (TMAH), development was conducted until silicon wafer of the irradiated part was exposed. Then, the film was rinsed with water, and the minimum exposure amount (sensitivity) and the resolution required for forming a pattern capable of obtaining 70% or more of the film remaining ratio (the ratio in film thickness before and after the development). The results are shown in Table 1. It can be said that a pattern can be formed easily when the minimum exposure amount is small. Further, it can be said that a smaller resolution leads to formation of a finer pattern.

[Evaluation of Mechanical Strength]

The composition was applied to silicon wafer by spin coating, followed by heating at 120° C. for 3 minutes, thereby to form a coating film with a thickness of 15 µm. Thereafter, the coating film was heated for 10 minutes at 200° C. in the nitrogen atmosphere in an inert gas oven. Further, the film was heated at 320° C. for 1 hour to obtain a cured film. This cured film was immersed in an aqueous hydrofluoric acid solution together with the silicon substrate. The cured film was peeled off from the substrate, washed with water and dried. Thereafter, the elongation at break was measured (measured by means of a tension testing machine). The results are shown in Table 1.

[Evaluation of Chemicals Resistance]

The composition was applied to aluminum wafer on which aluminum had been deposited by spin coating, followed by heating at 120° C. for 3 minutes, thereby to form a coating film with a thickness of 8 µm. Thereafter, the coating film was heated for 10 minutes at 200° C. in the nitrogen atmosphere in an inert gas oven. Further, the film was heated at 320° C. for 1 hour to obtain a cured film. The patterned cured film on the aluminum substrate was immersed in an electroless nickel plating solution composed mainly of an aqueous alkaline solution (a mixed aqueous solution of Melplate FZ-7350 and Melplate FBZ2 (FZ-7350/FBZ2/water=200 ml/10 ml/790 ml)) for 10 minutes at 23° C. From the pattern of the opening, occurrence of the sinking of chemicals to the interface between the substrate and the resin layer (chemicals resistance) was confirmed by metallurgical microscopic observation from above or by SEM (scanning electron microscope) observation of the cross section. The results are shown in Table 1.

In the table, a film in which sinking could be confirmed by metallurgical microscopic observation was indicated as "C", a film in which sinking could not be confirmed by metallurgical microscopic observation but could be confirmed by cross-sectional observation by SEM was indicated as "B" and a film in which sinking could not be confirmed by metallurgical microscopic observation and SEM observation was indicated as "A".

[Evaluation of Storage Stability]

After keeping the composition for two weeks in a thermostat chamber of 23° C., the composition was applied to wafer by spin coating at the same number of rotation as that before storage. The change in film thickness was examined. Further, the film was exposed to i rays of 100 to 1000 mJ/cm² through an interface filter using an ultrahigh pressure mercury lamp. After the exposure, by using an aqueous 2.38 wt % solution of tetramethylammonium hydroxide (TMAH), development was conducted until silicon wafer of the irradiated part was exposed. Then, the film was rinsed with water, and the minimum exposure amount (sensitivity) and the resolution required for forming a pattern capable of obtaining 70% or more of the film remaining ratio (the ratio in film thickness before and after the development). As compared with those before storage, a film which underwent a change in thickness of less than ±1.0 µm and a change in sensitivity of less than ±25 mJ/cm² was evaluated as "A", a film which underwent a change in thickness of less than –±1.0 µm and a change in sensitivity of less than ±50 mJ/cm² was evaluated as "B" and a film underwent a change in thickness of ±1.0 µm or more or a change in sensitivity of –±40 mJ/cm² or more was evaluated as "C".

TABLE 1

|  |  |  | Examples |  |  |  |  |  |  |  |  |  |  |  |  | Com. Ex. |  |  |
|---|---|---|---|---|---|---|---|---|---|---|---|---|---|---|---|---|---|---|
|  |  |  | 1 | 2 | 3 | 4 | 5 | 6 | 7 | 8 | 9 | 10 | 11 | 12 | 13 | 1 | 2 | 3 |
| (a) | Polymer | I | 100 | 100 | 100 | 100 | — | — | — | 100 | 100 | 100 | 100 | 100 | 100 | 100 | 100 | 100 |
|  |  | II | — | — | — | — | 100 | — | — | — | — | — | — | — | — | — | — | — |
|  |  | III | — | — | — | — | — | 100 | — | — | — | — | — | — | — | — | — | — |
|  |  | IV | — | — | — | — | — | — | 100 | — | — | — | — | — | — | — | — | — |
| (b) | B1 |  | 10 | — | — | 10 | 10 | 10 | 10 | 10 | 5 | 5 | 50 | 25 | 0.5 | — | — | — |
|  | B2 |  | — | 10 | — | — | — | — | — | — | — | — | — | — | — | — | — | — |
|  | B3 |  | — | — | 10 | — | — | — | — | — | — | — | — | — | — | — | — | — |
| (b') | B4 |  | — | — | — | — | — | — | — | — | — | — | — | — | — | 10 | — | — |
|  | B5 |  | — | — | — | — | — | — | — | — | 5 | — | — | — | — | — | 10 | — |
|  | B6 |  | — | — | — | — | — | — | — | — | — | 5 | — | — | — | — | — | — |
| (c) | C1 |  | 11 | 11 | 11 | — | 11 | 11 | 11 | 11 | 11 | 11 | 11 | 11 | 11 | 11 | 11 | 11 |
|  | C2 |  | — | — | — | 11 | — | — | — | — | — | — | — | — | — | — | — | — |
| (d) | BLO/PGMEA |  | 150 | 150 | 150 | 150 | 150 | 150 | 150 | — | 150 | 150 | 150 | 150 | 150 | 150 | 150 | 150 |
|  | NMP |  | — | — | — | — | — | — | — | 150 | — | — | — | — | — | — | — | — |
|  | Sensitivity (mJ·cm⁻²) |  | 220 | 230 | 240 | 220 | 220 | 240 | 250 | 200 | 250 | 280 | 300 | 280 | 300 | 250 | 240 | — |
|  | Resolution (µm) |  | 3 | 3 | 3 | 4 | 3 | 3 | 4 | 4 | 4 | 5 | 5 | 5 | 5 | 4 | 4 | — |
|  | Elongation at break (%) |  | 80 | 80 | 70 | 70 | 75 | 75 | 20 | 70 | 50 | 40 | 60 | 70 | 50 | 60 | 50 | 3 |
|  | Resistance to chemicals |  | A | A | A | A | A | A | B | A | B | B | B | A | B | C | C | C |
|  | Storage stability |  | A | A | A | A | A | A | B | A | A | C | A | A | A | A | A | A |

As for Comparative Example 3, measurement of sensitivity and resolution could not be conducted since the pattern was molten at the time of curing.

As shown in Table 1, each of the cured films obtained in Examples 1 to 13 showed sensitivity and resolution which practically posed no problems. Further, they had excellent mechanical strength and resistance to chemicals. On the other hand, in Comparative Examples 1 to 3 in which the component (b) was not used, adhesion with a substrate was weak, and hence, a large degree of sinking of chemicals was observed. Further, in Comparative Example 3, in which no cross linking agent was used, the pattern was molten at the time of heat curing, and the film had poor mechanical strength.

INDUSTRIAL APPLICABILITY

The positive sensitive resin composition of the invention can be used as a material for a cured film which serves as a surface protective film, an interlayer insulating film or the like of an electronic component.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. A positive photosensitive resin composition comprising:
   (a) a resin capable of being dissolved in an aqueous alkaline solution, wherein the resin is a polymer having a phenolic hydroxyl group and a structural unit represented by the following formula (I):

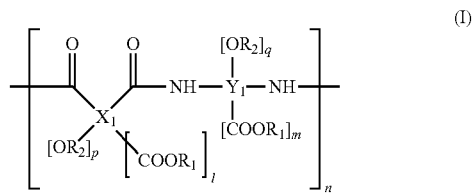

wherein $X_1$ is an organic group having 2 to 8 valences; $Y_1$ is an organic group having 2 to 8 valences; $R_1$ is independently a hydrogen atom or an organic group having 1 to 20 carbon atoms; $R_2$ is independently hydrogen or a monovalent organic group; p and q are independently an integer of 0 to 4; l and m are independently an integer of 0 to 2; l+m+p+q is 1 or more; and n is an integer of 2 or more indicating the number of structural units in the polymer;
(b) a compound having two or more oxetanyl groups in each molecule;
(c) a diazonaphthoquinone compound represented by the following formula (C1); and

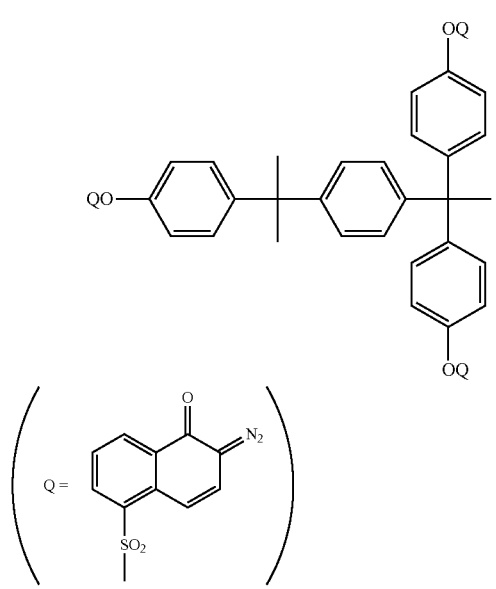

(d) a solvent,
wherein all compositions containing a catalyst for accelerating the ring-opening reaction of oxetanyl groups, other than the diazonaphthoquinone compound represented by the formula (C1), are excluded from the positive photosensitive resin composition.

2. The positive photosensitive resin composition according to claim 1, wherein the component (b) is a compound represented by the following formula:

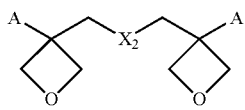

wherein $X_2$ is a single bond or a divalent organic group containing at least one of an alkylene group, an aromatic ring, an oxygen atom and a sulfur atom; and A is an alkyl group having 1 to 10 carbon atoms.

3. The positive photosensitive resin composition according to claim 1, wherein the component (b) is contained in an amount of 1 to 40 parts by weight and the component (c) is contained in an amount of 1 to 50 parts by weight relative to 100 parts by weight of component (a).

4. A cured film obtained by curing the positive photosensitive resin composition according to claim 1.

5. A method for producing a patterned cured film comprising the steps of:
applying the positive photosensitive resin composition according to claim 1 on a supporting substrate, followed by drying to form a photosensitive resin film;
exposing the photosensitive resin film to light;
developing the photosensitive resin film after the light exposure in an aqueous alkaline solution to obtain a patterned resin film; and
subjecting the patterned resin film to a heat treatment to obtain a patterned cured film.

6. An electronic component comprising the cured film according to claim 4 as an interlayer insulating layer or a surface protective layer.

7. The positive photosensitive resin composition according to claim 1, wherein the component (b) is a compound represented by the following formula:

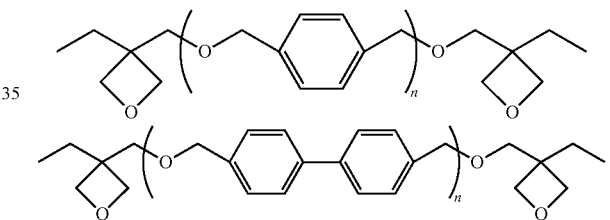

wherein n is an integer of 0 to 3.

8. The positive photosensitive resin composition according to claim 1, wherein a methylol group-containing compound and an epoxy group-containing compound are not substantially contained in the positive photosensitive resin composition.

9. The positive photosensitive resin composition according to claim 1, wherein the total amount of the components (a), (b) and (c) is at least 90 wt % relative to the total weight of the composition excluding the solvent.

* * * * *